(12) United States Patent
Ko et al.

(10) Patent No.: US 6,806,161 B2
(45) Date of Patent: Oct. 19, 2004

(54) PROCESS FOR PREPARING INSULATING MATERIAL HAVING LOW DIELECTRIC CONSTANT

(75) Inventors: Min-Jin Ko, Seoul (KR); Hye-Yeong Nam, Cheongju (KR); Dong-Seok Shin, Seoul (KR); Myung-Sun Moon, Daejeon (KR); Jung-Won Kang, Seoul (KR)

(73) Assignee: LG Chem Investment, Ltd., Seoul (KR)

( * ) Notice: Subject to any disclaimer, the term of this patent is extended or adjusted under 35 U.S.C. 154(b) by 248 days.

(21) Appl. No.: 09/844,553

(22) Filed: Apr. 27, 2001

(65) Prior Publication Data

US 2001/0055891 A1 Dec. 27, 2001

(30) Foreign Application Priority Data

Apr. 28, 2000 (KR) ........................................ 2000-22737
Dec. 19, 2000 (KR) ........................................ 2000-78658

(51) Int. Cl.[7] .............................................. H01L 21/76
(52) U.S. Cl. ........................ 438/409; 438/623; 438/960
(58) Field of Search ................................ 438/781, 784, 438/622–641, FOR 355, FOR 395; 427/226, 243, 247

(56) References Cited

U.S. PATENT DOCUMENTS 5,955,786 A 9/1999 Avanzino et al.

FOREIGN PATENT DOCUMENTS

| EP | 0 997 497 A1 | 5/2000 |
|---|---|---|
| JP | 2000021872 | 1/2000 |

*Primary Examiner*—George Fourson
*Assistant Examiner*—Thanh V Pham
(74) *Attorney, Agent, or Firm*—Fish & Richardson

(57) ABSTRACT

The present invention relates to low dielectric materials essential for a semiconductor having high density and high performance of the next generation, particularly to a process for preparing a porous interlayer insulating film having low dielectric constant containing pores with a size of a few nanometers or less.

The present invention provides a process for preparing a porous wiring interlayer insulating film having very low dielectric constant for a semiconductor device comprising the steps of a) preparing a mixed complex of pore-forming organic molecules and a matrix resin, b) coating the mixed complex on a substrate, and c) heating the mixed complex to remove the organic molecules therefrom, thereby forming pores inside the complex.

The porous wiring interlayer insulating film having very low dielectric constant prepared according to the process of the present invention has reduced phase-separation, excellent processibility, isotropic structure and very small pores with a size of a few nanometers or less.

12 Claims, No Drawings

PROCESS FOR PREPARING INSULATING MATERIAL HAVING LOW DIELECTRIC CONSTANT

CROSS REFERENCE TO RELATED APPLICATION

This application claims priorities of Korea patent Application No. 2000-22737, filed on Apr. 28, 2000, and Korean patent Application No. 2000-78658, filed on Dec. 19, 2000.

BACKGROUND OF THE INVENTION (a) Field of the Invention

The present invention relates to a low dielectric material essential for a next generation semiconductor device having high density and high performance, and particularly to a process for preparing a porous interlayer insulating film having low dielectric constant containing pores having a size of a few nanometers or less.

(b) Description of the Related Art

The semiconductor industry is moving toward increasing device complexity, requiring shrinking geometric dimensions and higher component integration with greater dimensional densities in integrated circuit devices, e.g. memory and logic chips. This has led to an increase in the number of wiring levels and a reduction in the wiring pitch to increase the wiring density. Current leading-edge logic processors have 6–7 levels of high density interconnect, and interconnect line width is scheduled to decrease to 0.1 $\mu$m around the year 2005.

As device dimensions shrink to less than 0.25 $\mu$m, the propagation delay, crosstalk noise, and power dissipation due to resistance-capacitance (RC) coupling become significant. The smaller line dimension increases the resistivity of metal wires, and the narrow intermetal spacing increases the capacitance between the metal wires. Thus although the speed of the device will increase as the feature size decreases, the interconnect delay becomes the major fraction of the total delay and limits the overall chip performance. Accordingly, in order to prepare a chip having high speed, a conductor having a low resistance and a dielectric material having low dielectric constant should be used. In addition, the use of a low dielectric material can remarkably decrease the power dissipation and crosstalk noise.

Recently, several semiconductor device manufacturers have put test products on the market that show improvement in their performance of 20% or more, using copper wiring with high electric conductivity instead of using the conventional aluminum wiring. Recently they shift to use of new materials that exhibit low dielectric constant performance, for use in interconnects. If the dielectric films between interconnect layers in integrated circuit can make use of these materials, the effect on operating speed will be the same as that which resulted with the switch from aluminum to copper technology. For instant, if the dielectric constant of the dielectric material is changed from 4.0 to about 2.5, IC operating speed will be improved by about 20%.

The interlayer dielectric material used in semiconductor integrated circuit devices is predominantly $SiO_2$, which is generally formed using chemical vapor deposition (CVD) or plasma enhanced techniques and has the requisite mechanical and thermal properties to withstand various processing operations associated with semiconductor manufacturing. The relative dielectric constant of a $SiO_2$ material varies with the conditions under which a dielectric is formed; that of silicon thermal oxidation films, which have the lowest dielectric constant, is of the order of 4.0. Attempts have been made to reduce the dielectric constant by introducing fluorine atoms into an inorganic film deposited by CVD. However, the introduction of fluorine atoms in large amounts decreases the chemical and thermal stability, so the dielectric constant achieved in actual practice is of the order of 3.5. Fluorinated oxides can provide an immediate near-term solution and a shift to new types of insulating materials with sub-3 dielectric constant may be required.

One class of candidate is organic polymers, some of which have a dielectric constant less than 3.0. Incorporating fluorine into such organic polymers is known to further lower the dielectric constant. Most organic polymers do not, however, possess the physico-chemical properties required for on-chip semiconductor insulation, particularly thermal stability and mechanical properties (sufficient to withstand back end of the line fabrication temperatures within the range of 400~450° C.). Few organic polymers are stable at temperatures greater than 450° C. They also have a low glass transition temperature and thus elasticity thereof remarkably decreases at high temperature, and they have a very high linear expansion coefficient. Since temperature rises to up to 450° C. during semiconductor IC integration and packaging processes, the resulting low thermal stability and elasticity and high linear expansion coefficient can deteriorate the reliability of the device.

Recently in order to solve thermal stability problems of organic polymers, the development of organic silicate polymers using a sol-gel process has emerged. In particular, organic SOG (Spin On Glass) has been proposed for use as interlayer dielectrics in which the side chain of an organic component (an alkyl group such as methyl) is bonded to the backbone chain of a siloxane bond. It has a lower dielectric constant, e.g., the range of about 2.7~3.2, than conventional glasses.

The development of interlayer insulating materials having a low dielectric constant of 2.5 or less is necessary for developing devices of high performance and high density of the next generation, and in order to do this, the introduction of air having a dielectric constant of 1 into materials having dielectric constant of 3.0 to 2.5 is needed.

Brinker et al., U.S. Pat. No. 4,652,467 present a method of forming porous dielectric films on substrates. The process uses a sol-gel technique for depositing porous films with controlled porosity and pore size, wherein a solution is deposited on a substrate, gelled, and then cross-linked and densified by removing the solvent through evaporation, thereby leaving a porous dielectric. Dielectric formed by this method, generally referred to as xerogels, has pores that are generally interconnected, rather than being isolated cells. Dielectrics are typically 10~50% porous with a permanent film thickness reduction of at least 20% during drying.

Sakamato et al. U.S. Pat. No. 5,103,288 report a method to fabricate low density dielectric films on a substrate containing 50% to 80% porosity. The porous insulating film is typically formed by applying a mixture of an acidic oxide and basic oxide on a substrate, heat-treating to precipitate the basic oxide, and then dissolving out the basic oxide. However dissolving all the basic oxide out of such a dielectric film may be difficult and several of elements described for use in the basic oxide such as sodium and lithium can contaminate electronic devices.

Nguyen et al., Chem. Mater. 1999, 11, 3080~3085 describe a method to fabricate porous organosilicates useful for on-chip insulator applications by using precondensed organic silicate and thermally labile polymers. The process involves spin coating a mixture of the matrix material and the thermally labile polymers followed by thermal curing to initiate vitrification and decomposition of the polymers. The microphase-separated domain is formed during the condensation of the organic silicate. However, since the polymers used to form pores have low compatibility with a matrix resin, phase-separated domain tend to become large, and if the contents of polymers increase, an opaque film will easily form. In addition, it may be difficult to generate very small sized pores due to the use of polymers, and to form pores of a uniform size due to the distribution of molecular weight.

Mikoshiba et al., J. Mat. Chem., 1999, 9, 591~598, describe the preparation of porous films containing angstrom size pores. Copolymers comprising methyl(trisiloxysilyl) units and alkyl(trisiloxysilyl) units are spin-coated and cured at 250° C. to provide rigid organic polysilicates. Then films are heated up to 450 or 500° C. to remove thermally labile alkyl groups and pores are formed corresponding to the sizes of the substituents. Trifluoropropyl, cyanoethyl, phenethyl and propyl groups are investigated as the thermally labile substituents. Only the trifluoropropyl group works well under the limitation of final curing temperatures up to 450° C. or 500° C., the pores collapsing for films bearing other substitiuents.

SUMMARY OF THE INVENTION

The present invention is made in consideration of the problems of the prior art, and it is an object of the present invention to provide a process for preparing a wiring interlayer insulating film having very low dielectric constant that can make the speed of a semiconductor device higher, decrease consumption of electric power, and remarkably decrease interference between metal wirings.

It is another object of the present invention to provide a process for preparing wiring interlayer insulating film having very low dielectric constant containing pores with a size of a few nanometers or less.

It is another object of the present invention to provide a process for preparing wiring interlayer insulating film having very low dielectric constant in which phase-separation is reduced.

In order to achieve these objects, the present invention provides a process for preparing porous wiring interlayer insulating film having very low dielectric constant for a semiconductor comprising the steps of;
a) preparing a mixed complex of pore-forming organic molecules and matrix resin;
b) coating the mixed complex on a substrate; and
c) heating the mixed complex to remove the organic molecules therefrom, thereby forming pores inside the complex.

The present invention also provides an interlayer insulating film for metal wiring of a semiconductor prepared according to the process.

The present invention also provides a semiconductor device comprising the interlayer insulating film for metal wiring prepared according to the process.

DETAILED DESCRIPTION AND THE PREFERRED EMBODIMENTS

The present invention provides a low dielectric resin composition useful as e.g. a resin composition capable of forming a uniform dielectric film having a nanopore useful for electrical insulating insulating layer on electrical devices.

The present invention provides a low dielectric resin composition comprising the following components (a) and (b), and a process for its production. A dielectric film formed by the resin composition of the present invention is a film having a dielectric constant at most 3.3, preferably less than 3.0, more preferably less than 2.7, wherein a cured product prepared by the component (a) and component (b) are uniformly cross-linked by a chemical reaction, followed by the removal of the organic part of the component (b). According to this process since phase-separation is inhibited compared to the conventional process, an insulating film that has excellent processability, isotropic structure, and very small pores with molecular size can be formed.

(a) organosilane component includes at least one compound selected from the group consisting of
(a-1) organosilane of the Chemical Formula 1: $R^1_m R^2_n SiX_{4-m-n}$ (where each of $R^1$ and $R^2$ which may be the same or different, is a non-hydrolysable group, X is a hydrolysable group, and m and n are integers of from 0 to 3 satisfying $0 \leq m+n \leq 3$) and/or a partially hydrolyzed condensate thereof
(a-2) organic bridged silane of the Chemical Formula 2: $R^3_p Y_{3-p} Si—M—SiR^4_q Z_{3-q}$ (where each of $R^3$ and $R^4$ which may be the same or different, is a non-hydrolysable group, Y and Z which may be the same or different, is an hydrolysable group, M is an alkylene or arylene group, and p and q are integers of from 0 to 2 and/or a cyclic oligomer with organic bridge unit (Si—M—Si).
and/or a partially hydrolyzed condensate thereof
(b) pore-forming component containing decomposable organic molecules by thermal curing with/without irradiation.

As the component (a) suitable silane compounds used in the present invention include a silane precursor comprising silicon, oxygen, carbon and hydrogen, and an organic polysilicate prepolymer prepared therefrom. It is preferably selected from the group consisting of a compound represented by the following Chemical Formula 1, Chemical Formula 2, and a mixture thereof, or an organic silicate prepolymer prepared therefrom. In the Formula 1, each $R^1$ and $R^2$ is independently hydrogen, alkyl such as methyl, ethyl, propyl, butyl, or others, fluorine-containing alkyl group such as trifluoromethyl, trifluoropropyl or others, alkenyl such as vinyl, allyl, or others, or aryl such as phenyl. Those alkyl groups may be linear or branched. X is independently hydrolysable group, halide such as chlorine, alkoxy such as methoxy, ethoxy or propoxy, acyloxy such as acetoxy, or others. Although there is no particular limitation with respect to the functional group $R^1$, $R^2$ and X, it is more preferred that $R^1$ and $R^2$ are independently hydrogen, alkyl or phenyl and X is an alkoxy group. Some examples of the component (a-1) organosilane include tetraalkoxysilane, monoalkyltrialkoxysilane, dialkcyldialkoxysilane, trialkylmonoalkoxysilane, trialkoxysilane, monoalkyldialkoxysilane, a mixture thereof etc. The partially hydrolyzed product of the organosilane precursor can be obtained by allowing a monomer or an oligomer to react in an organic solvent after addition of water and a catalyst at a temperature not higher than the boiling point of the organic solvent for a state time. In the Formula 2, each of $R^3$ and $R^4$ is independently hydrogen, alkyl such as methyl, ethyl, propyl, butyl, or others, fluorine-containing alkyl group such as trifluoromethyl, trifluoropropyl or others, alkenyl such as vinyl or allyl, or aryl such as phenyl, Y and Z are independently hydrolysable group, halide such as chlorine, alkoxy such as methoxy, ethoxy or propoxy, acyloxy such as acetoxy, or others. When $R^3$ and/or $R^4$ are alkenyl, it may be further bridged by a method of hydrosilylation reaction described below. Organic bridged unit, M may be alkylene or phenylene, preferably methylene, ethylene, propylene, phenylene, or a mixture thereof.

Synthesis of the organic bridged silane is afforded from hydrosilylation reaction of alkenyl containing silane or Grignard reaction of alkylhalide containing silane. In hydrosilylation, reaction was conducted between a silane precursor containing a Si—H group with a silane precursor containing aliphatic unsaturated carbon (—CH=CH$_2$) in presence of a catalyst or free radical initiator. Preferred catalysts are the platinum group metal containing catalysts. They can be any of those known in the art to effect a hydrosilylation reaction between a silicon-bonded hydrogen atom and an unsaturated carbon—carbon bond, e.g. platinum, palladium, osmium, iridium, and ruthenium etc. A transition metal catalyst such as platinum, or a free radical initiator is employed in an effective amount, depending on the particular catalyst used.

Cyclic oligomer with organic bridge (Si—M—Si) unit can be synthesized by the hydrosilylation reaction of a oligomer of ring structure (I) and/or ring structure (II), i.e. an addition reaction between a silane precursor containing a Si—H group with a cyclic oligomer (I) and/or (II) containing aliphatic unsaturated carbon (—CH=CH$_2$) in presence of a catalyst or free radical initiator,

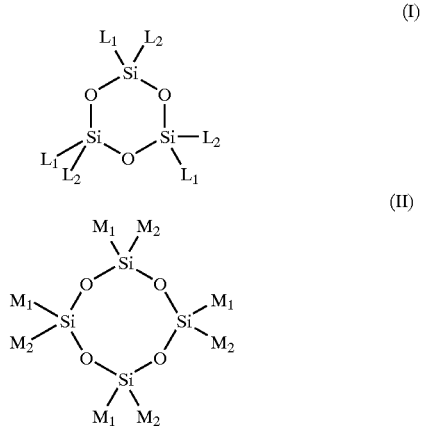

where $L_1$ is independently alkenyl such as vinyl or allyl, $L_2$ is independently hydrogen, alkyl such as methyl, ethyl or others, or aryl such as phenyl, $M_1$ is independently alkenyl such as vinyl or allyl, $M_2$ is independently hydrogen, alkyl such as methyl, ethyl or others, or aryl such as phenyl.

As the component (b) a pore-forming material used in the present invention is radiation decomposable or preferably thermally decomposable. The radiation decomposable small molecules decompose upon exposure to radiation; e.g. ultraviolet, x-ray, electron beam or the like. The thermally decomposable small molecules used as a pore-forming material have at least one silyl functional group at the end, so that a pore-forming material can be connected by a covalent bonding with the component (a). The pore-forming material component (b) may be mixed with partially hydrolyzed condensate prepared from the component (a), or it can be added when preparing a partially hydrolyzed condensate of the component (a). The pore-forming material is an organic molecules with a silyl group, preferably at the end. The organic part of the pore-forming material can be any organic aliphatic and/or aromatic hydrocarbon containing organic linkage groups that can be decomposed at 200~500° C., such as ether containing organic molecule, ester containing organic molecules, amide containing organic molecules, carbonate group containing organic molecules, carbamate group containing organic molecules, anhydride group containing organic molecules, amine group containing organic molecules, enamine group containing organic molecules, imine group containing molecules, azo group containing organic molecules, thio-ether group containing organic molecules, sulfone group containing organic molecules, sulfoxide group containing organic molecules, isocyanate group containing organic molecules, isocyanurate group containing organic molecules, triazine group containing organic molecules, acid group containing organic molecules, epoxy group containing organic molecules, and the like. Organic linkage groups may exist in linear chain and/or cyclic structure. The organic part of the component (b) may contain one functional linkage group or in combination of two or more thereof. The sillane part of the component (b) has at least one functional group to react with the component (a). The preferred functional groups are alkoxy (methoxy, ethoxy, propoxy etc), acyloxy (such as acetoxy), hydroxyl, or halide (such as chlorine).

The cross-linking reaction between the component (a) and the component (b) may take place in the state of the solution or during the state of forming the coating film. In present invention, a component (a) or a mixture of component (a) and (b) can be partially hydrolyzed and condensed in an organic solvent after addition of water and catalyst. When the cross-linking reactions partially take place in the state of the solution to form uniformly distributed copolymer, the component (b) can be added to any state of hydrolysis and condensation of a component (a). The component (b) can be also added to partially hydrolyzed condensate of component (a) before forming the coating film.

Solvents which may be used include any agent or mixture of agents which will dissolve the composition to form a homogeneous liquid mixture of the component (a) and (b). The solvents used for hydrolysis and condensation of the component (a) or a mixture of component (a) and (b) include aliphatic hydrocarbon solvents, such as n-pentane, isopentane, n-hexane, isohexane, cyclohexane and the like; aromatic hydrocarbon solvents, such as benzene, toluene, xylene, alky benzene, naphthalene and the like; alcohol solvents such as methanol, ethanol, n-propanol, isopropanol, n-butanol, isobutanol, t-butanol, cyclohexanol, methylcyclohexanol and the like; ether solvents, such as tetrahydrofuran, 2-methyltetrahydrofuran, ethyl ether, n-propyl ether, isopropyl ether, n-butyl ether, diglyme, dioxane, dimethyl dioxane, ethylene glycol monomethyl ether, ethylene glycol monoethyl ether, ethylene glycol dimethyl ether, ethylene glycol diethyl ether, propylene glycol monomethyl ether, propylene glycol monoethyl ether and the like; ester solvents, such as ethyl formate, methyl acetate, ethyl lactate, diethyl carbonate, ethylene carbonate, ethylene glycol monomethyl ether acetate, propylene glycol monoethyl ether acetate, ethylene glycol diacetate and the like; amide solvents, such as N-methyl pyrrolidone, formamide, N-methyl formamide, N,N-dimethyl formamide, N-ethyl formamide, N, N-diethyl formamide, N-methyl acetamide, N-ethyl acetamide and the like. Solvents that have been used in hydrolysis and condensation are completely removed after the reactions to obtain organic silicate polymer as an oil or a powder, which can be dissolved in film-forming solvent and used, or the organic solvent that has been used in hydrolysis and condensation can be directly used for film-forming.

As the catalyst, an acid or a base may be used. Examples of the catalysts used in the present invention include inorganic acids, such as hydrochloric acid, hydrofluoric acid, nitric acid, sulfuric acid, phosphoric acid and the like; and organic acids, such as formic acid, acetic acid, propionic acid, butanoic acid, pentanoic acid, oxalic acid, maleic acid, malonic acid, malic acid, butyric acid, sulfonic acid, phthalic acid, fumaric acid, citric acid, tartaric acid and the like; inorganic bases, such as ammonia, sodium hydroxide, potassium hydroxide, calcium hydroxide and the like; and organic base, such as pyridine, piperazine, piperidine, choline, diethylamine, triethylamine, monoethanolamine, diethanolamine, triethanolamine, monomethyldiethanolamine, dimethylmonoethanolamine and the like. Other catalysts such as metal chelate compounds and salt catalysts can be also used in this invention. The amount of catalyst used in general is 1 mole or less, preferably 0.5 mole or less, per mole of the component (a) or per mole of the sum of component (a) and component (b). The acid and base catalysts may be used individually or in combination.

There are no particular limitations on the reaction temperature when the product is made to have a desired molecular weight. The temperature may preferably be not higher than the boiling point of the organic solvent used, and may preferably be 0° C. to 80° C. in order to control the molecular weight of the resultant hydrolyzed product. There are no particular limitations on the reaction time at the time of hydrolysis, and the reaction may be completed at the time the product reaches a stated molecular weight. It is usually preferred to set the molecular weight of the partially hydrolyzed condensate product of a component (a) or a mixture of components (a) and (b) within a range of from 500 to 1000,000 as a weight average molecular weight. If the molecular weight of a hydrolyzed condensate of the component (a) or a mixture of components (a) and (b) is less than 500, it may be difficult to form a uniform coating film, and if the molecular weight of a hydrolyzed condensate is greater than 1000,000, condensate polymer may become insoluble. The solid content concentration in the solution, as the sum of the resin component (a) and resin component (b), may suitable be selected from the viewpoint of the desired viscosity of the solution or the film thickness of the coating film, within the range where the solid content dissolves.

In the second step of the process of the present invention, the resin composition containing a mixture of a partially pre-condensed organic silicate component (a) and component (b) or a co-condensate of a mixture of components (a) and (b) is applied to the substrate by methods, followed by heating and drying to evaporate solvent. Here the composition is applied to a substrate by methods known in the art such as spin coating, dip coating, spray coating, flow coating, screen printing or others. The coating method may suitably selected depending on the shape of the substrate to be coated, the required film thickness, etc. When the composition of the present is to be applied to an interlayer dielectric film for a semiconductor device, spin coating method is preferred, since the in-plane distribution of the film thickness will thereby be uniform. The thickness of coating can be controlled by the solid content concentration and the speed of spin. The coatings produced by the method herein are on any substrate such as metals or ceramics but are particularly useful on electronic substrates intended for use in manufacture of a semiconductor component including opto-electronic devices, photovoltaic cells, 3-D devices, silicon-on insulator devices, supperlattice devices and the like.

The last step of the process of the present invention involves heating at a temperature sufficient to effect thermolysis of the organic molecule part of component (b) crosslinked within the matrix of the condensed rigid organic polysilicate. The heating may be conducted as a single-step process or a step-wise process. In the step-wise process the resin composition is first heated to an elevated temperature to effect curing without significant thermolysis. Generally this temperature can be in the range of from about 150 to 350° C. Then, the cured composition is further-heated to effect thermolysis of the organic molecule part of component (b). Generally, it is preferred that thermolysis step is performed at a temperature in a range of from 350° C. to about 600° C., preferably in the range of from 350° C. to 500° C. Photochemically labile organic molecules can be decomposed by exposure of the composition to suitable radiation to cause photodecomposition. In the single step heating process the curing of the resin composition and thermolysis of the organic molecule part of component (b) are effected simultaneously by heating to a temperature within a range of greater than 350° C. up to the lesser of the decomposition temperature of the organic silicate resin.

Any method of heating such as the use of a convention oven, rapid thermal processing, hot plate, or radiant of microwave energy may be used herein. The method used should be capable of rapidly heating the film to the desired temperature. The duration of time that the coating is heated to cure and to decompose will depend on the environment during the heating, the temperature at which it is heated, the rate at which it is heated, and the thickness of the film. At higher cure temperature, and/or higher concentrations of oxygen in the cured environment the cure and decomposition time will be shorter. Generally the coating is heated at cured temperature and decomposition temperature from 1 second to 4 hours. The heating may take place any environment, however preferably an inert environment such as nitrogen, argon, helium or vacuum condition.

The thermolysis of the organic molecule part of component (b) results in the formation of a nanoporous dielectric composition. By the term "nanoporous" it is meant that dielectric composition of the present invention median pore diameter less than about 20 nm, preferably has a median pore diameter within a range of about 0.3 nm to 10 nm, more preferably within a range of about 0.3 to 5 nm, more like molecular sized pore. The dielectric composition of the present has a dielectric constant less than 3.3 and preferably less than 3.0, more preferably 2.7 at 25° C. The dielectric composition comprises about 5 to 70%, preferably about 5 to 60% by volume of pores. The dielectric composition is optically clear, isotropic structure.

[Structural Formula 1]

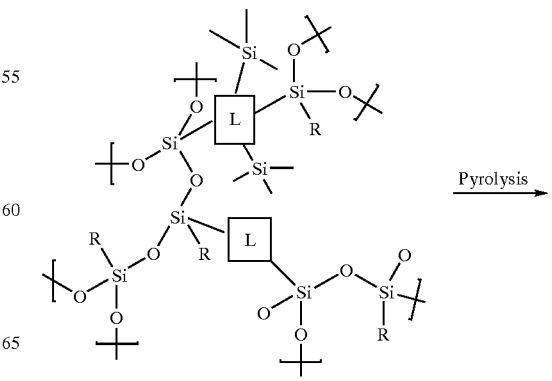

-continued

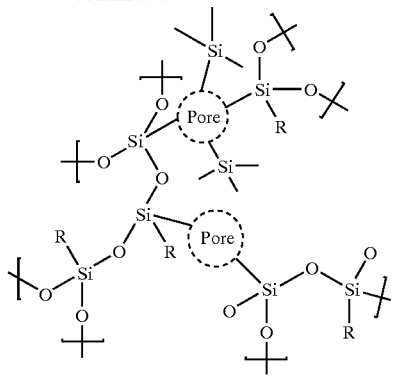

Wherein L is an organic molecule part of the component (b).

The following examples are provided to illustrate the present invention. The detailed preparations fall within the scope of, and serve to exemplify, the more generally described methods set forth above. These examples are presented for illustrative purposes only, and should not used to limit the scope of this invention found in the claims.

EXAMPLE

Preparation of Pore-Forming Materials

Example 1

20 μl of platinum catalyst (Kartedt cat.) was added to 1.5 g of pentaerythritol tetra acrylate (tetramer) and they were reacted for about 15 minutes, and then 5.8 ml of trimethoxysilane was added thereto and reaction was continued for 10 hours. Reaction was confirmed with an NMR spectrum and remaining silane was removed at 45° C. under vacuum.

Example 2

The similar procedure as in example 1 was followed, except that triallyl-1,3,5-triazine-2,4,6-trione was used to prepare tris[3-(trimethoxysilyl)propyl]isocyanurate.

Preparation of Mixed Complex Organosilicate Containing Pore-Forming Materials and Porous Dielectric Films

Example 3

5.73 g of methyltrimethoxysilane and 1.14 g of bistrimethoxysilylethane were mixed with 15 ml of tetrahydrofuran solvent, and the temperature thereof was lowered to 5° C. To the mixed solution, 0.7 ml of 2 N hydrochloric acid diluted with 1.2 ml of distilled water were slowly added thereto while stirring. After reaction at 70° C. for overnight, the solution was cooled to room temperature, and then it was diluted with toluene and washed with distilled water until the pH thereof became neutral. Magnesium sulfate was introduced into the obtained organic layer to completely remove remaining water therein, and the organic solvent was completely removed from the obtained organic layer in a vacuum oven.

The obtained powder and the product obtained according to the method of Example 2 were dissolved in methylisobutylketone. The obtained solution was filtered to remove impurities therefrom, spin-coated to obtain a thin film, and cured under a nitrogen atmosphere at 250° C. and 450° C. respectively for 2 hour to prepare a dielectric film.

The porous dielectric film that results has a dielectric constant of much less than that prepared without pore forming materials, and has less than few nanometer pores.

Example 4

7.6 ml of methyltrimethoxysilane, 0.9 ml of tetramethoxysilane, 4.05 ml of distilled water and 15 ml of tetrahydrofuran were mixed at room temperature, and then 0.8 ml of 2 N hydrochloric acid was slowly added to the mixture while stirring. After reaction at 70° C. for overnight, the solution was cooled to room temperature, and then it was diluted with toluene and washed with water until the pH became neutral. Magnesium sulfate was introduced into the obtained organic layer to completely remove remaining water therein, and the organic solvent was completely removed from the obtained organic layer in a vacuum oven.

The obtained powder and the product obtained according to the method of Example 2 were dissolved in methylisobutylketone. The obtained solution was filtered to remove impurities there from, spin-coated to obtain a thin film, and cured under a nitrogen atmosphere at 250° C. and 450° C. respectively for 2 hour to prepare a dielectric film.

Substantially the same results are expected.

Example 5

10 μl of 0.1 M platinum catalyst and 1.0 ml of 2,4,6,8-tetravinyl-2,4,6,8-tetramethyl siloxane were mixed and reacted in a completely dried reaction container at a room temperature for approximately 15 minutes, and then 3.15 ml of triethoxysilane was introduced therein and reaction was continued at 50° C. for several hours under a nitrogen atmosphere. Remaining reactants were completely removed under vacuum, and the completion of the reaction was confirmed with a NMR spectrum.

40 ml of tetrahydrofuran and 19 ml of methyltrimethoxy silane were mixed in another container and the temperature thereof was lowered to 5° C. under a nitrogen atmosphere. To the mixture solution, 10.24 ml of distilled water and 2.1 ml of 2.0 N hydrochloric acid were slowly added thereto while stirring. Then, the 2.1 ml of the hydrosilylation product was again slowly added. After reaction at 70° C. for overnight, the solution was cooled to room temperature, and then it was diluted with toluene and washed with water until the pH became neutral. Magnesium sulfate was introduced into the obtained organic layer to completely remove remaining water therein, and the organic solvent was completely removed from the obtained organic layer in a vacuum oven.

The obtained powder and the product obtained according to the method of Example 2 were dissolved in methylisobutylketone. The obtained solution was filtered to remove impurities therefrom, spin-coated to obtain a thin film, and cured under a nitrogen atmosphere at 250° C. and 450° C. respectively for 2 hour to prepare a dielectric film.

Substantially the same results are expected.

Example 6

7.6 ml of methyltrimethoxysilane, 2.5 ml of tetramethoxysilane, and 5.0 ml of the product obtained according to the method of Example 1 were mixed in 25 ml of polyethylene glycol monomethyl ether at room temperature, and then 0.25 ml of maleic acid and 4.5 ml of distilled water were slowly added to the mixture while stirring. The resulting mixture was reacted at 50° C. for 1 hour, and further reacted at 70° C. for several hours with adding 20 ml of methylisobutylketone. The resulting solution was filtered to remove impurities therefrom, spin-coated to obtain a thin film, and cured under a nitrogen atmosphere at 250° C. and 450° C. respectively for 2 hour to prepare a dielectric film.

Substantially the same results are expected.

Example 7

7.6 ml of methyltrimethoxysilane, 2.5 ml of tetramethoxysilane, and 5.0 ml of the product obtained according to the method of Example 2 were mixed in 25 ml of polyethylene glycol monomethyl ether at room temperature, and then 0.25 ml of acetic acid and 4.5 ml of distilled water were slowly added to the mixture while stirring. The resulting mixture was reacted at 50° C. for 1 hour and further reacted at 70° C. for several hours with adding 20 ml of methylisobutylketone. The resulting solution was filtered to remove impurities therefrom, spin-coated to obtain a thin film, and cured under a nitrogen atmosphere at 250° C. and 450° C. respectively for 2 hour to prepare a dielectric film.

Substantially the same results are expected.

What is claimed is:

1. A process for preparing a porous wiring interlayer insulating film having very low dielectric constant for a semiconductor comprising the steps of:
    a) preparing a mixed complex of matrix resin and pore-forming material, the matrix resin is selected from the group consisting essentially of:
        organosilane of Chemical Formula 1: $R^1_m R^2_n SiX_{4-m-n}$ (where each of $R^1$ and $R^2$ which may be the same or different, is a non-hydrolysable group selected from hydrogen, alkyl, fluorine-containing alkyl or aryl group; X is a hydrolysable group selected from halide, alkoxy or acyloxy; and m and n are integers of from 0 to 3 satisfying $0 \leq m+n \leq 3$) or a partially hydrolyzed condensate thereof;
        organic bridged silane of Chemical Formula 2: $R^3_p Y_{3-p} Si$—M—$SiR^4_q Z_{3-q}$ (where each of $R^3$ and $R^4$ which may be the same or different, is a non-hydrolysable group selected from hydrogen, alkyl, fluorine-containing alkyl, alkenyl or aryl; each of Y and Z which may be the same or different, is a hydrolysable group selected from halide, alkoxy or acyloxy; M is alkylene or arylene group; and p and q are integers of from 0 to 2) or a cyclic oligomer with organic bridge unit (Si—M—Si) or a partially hydrolyzed condensate thereof; and
        a mixture thereof; and
        the pore-forming material containing an organic part having one or more thermally decomposable organic linkage groups, and at least one silyl functional group at the terminal of the pore-forming material so that the pore-forming material can be connected by covalent bonding with the matrix resin;
    b) coating the mixed complex on a substrate; and
    c) heating the mixed complex to remove the organic part of the pore-forming material, thereby forming pores inside the complex.

2. The process according to claim 1, wherein in the Chemical Formula 1, $R^1$ and $R^2$ are independently hydrogen, alkyl or phenyl and X is an alkoxy group.

3. The process according to claim 1, wherein the organosilane is selected from the group consisting of tetraalkoxysilane, monoalkyltrialkoxysilane, dialkyldialkoxysilane, trialkylmonoalkoxysilane, trialkoxysilane, monoalkyldialkoxysilane, and a mixture thereof.

4. The process according to claim 1, wherein the organic bridged silane is synthesized by hydrosilylation reaction between a silane precursor containing a Si—H with a silane monomer containing aliphatic unsaturated carbon (—CH═CH$_2$—) in the presence of a catalyst.

5. The process according to claim 1, wherein the cyclic oligomer with organic bridged unit is synthesized by Grignard reaction of alkylhalide containing silane precursor.

6. The process according to claim 1, wherein the cyclic oligomer with organic bridge unit (Si—M—Si) is synthesized by hydrosilylation reaction of a silane precursor containing a Si—H with an oligomer of ring structure (I) and/or (II):

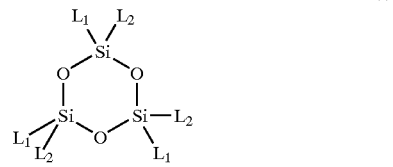

(I)

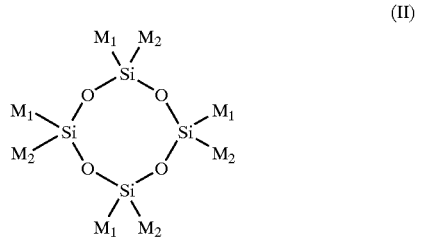

(II)

wherein $L_1$ is alkenyl, $L_2$ is hydrogen, alkyl or aryl, $M_1$ is alkenyl, and $M_2$ is hydrogen, alkyl or aryl.

7. The process according to claim 1, wherein the organic part of the pore-forming material contains organic linkage groups that can be decomposed at 200 to 500° C.

8. The process according to claim 1, wherein the step a) comprises
    partially hydrolyzing and condensing the matrix resin in an organic solvent after adding water and catalyst; and adding the pore-forming material to partially hydrolyzed condensate of the matrix resin; or
    partially hydrolyzing and condensing the mixture of the matrix resin and pore-forming material in an organic solvent after adding water and catalyst.

9. The process according to claim 8, wherein the molecular weight of the partially hydrolyzed condensate product of the matrix resin or a mixture of the matrix resin and the pore-forming material is 500 to 1,000,000 as a weight average molecular weight.

10. The process according to claim 1, wherein the step c) comprises:
    heating the mixed complex to 150 to 350° C. to effect curing without significant thermolysis; and
    further heating the cured complex to 350 to 600° C. to effect thermolysis of the organic molecule part of the pore-forming material.

11. The process according to claim 1, wherein the step c) comprises heating the mixed complex to 350° C. up to the lesser of decomposition temperature of the matrix resin to simultaneously effect curing of the complex and thermolysis of the organic molecule part of the pore-forming material.

12. The process according to claim 1, wherein the thermally decomposable organic linkage groups are selected from ether group, ester group, amide group, carbonate group, carbamate group, anhydride group, amine group, enamine group containing, imine, azo group, thio-ether group, sulfone, sulfoxide group, isocyanate group, isocyanurate group, triazine group, acid group, and epoxy group.

* * * * *